US007519187B2

(12) United States Patent
Konagai

(10) Patent No.: US 7,519,187 B2
(45) Date of Patent: Apr. 14, 2009

(54) ARRAY SPEAKER SYSTEM

(75) Inventor: Yusuke Konagai, Hamamatsu (JP)

(73) Assignee: Yamaha Corporation (JP)

( * ) Notice: Subject to any disclaimer, the term of this patent is extended or adjusted under 35 U.S.C. 154(b) by 242 days.

(21) Appl. No.: 10/558,947

(22) PCT Filed: Jun. 2, 2004

(86) PCT No.: PCT/JP2004/008008

§ 371 (c)(1),
(2), (4) Date: Nov. 30, 2005

(87) PCT Pub. No.: WO2004/107807

PCT Pub. Date: Dec. 9, 2004

(65) Prior Publication Data

US 2007/0030977 A1 Feb. 8, 2007

(30) Foreign Application Priority Data

Jun. 2, 2003 (JP) ............................. 2003-156768

(51) Int. Cl.
*H03G 5/00* (2006.01)
*H03G 9/00* (2006.01)
*H04R 3/00* (2006.01)

(52) U.S. Cl. ............................ 381/98; 381/102; 381/92

(58) Field of Classification Search ................... 381/96, 381/97, 95, 89, 77, 80, 82, 102, 92, 98
See application file for complete search history.

(56) References Cited

U.S. PATENT DOCUMENTS 3,308,237 A 3/1967 Novak
3,873,784 A 3/1975 Doschek
4,061,876 A 12/1977 Jaffe
4,191,852 A 3/1980 Nishikawa (Continued)

FOREIGN PATENT DOCUMENTS

JP 63-009300 A 1/1988

(Continued)

OTHER PUBLICATIONS

Relevant portion of International Search Report of corresponding PCT Application PCT/JP2004/008008.

(Continued)

*Primary Examiner*—Vivian Chin
*Assistant Examiner*—George C Monikang
(74) *Attorney, Agent, or Firm*—Rossi, Kimms & McDowell, LLP

(57) ABSTRACT

Input audio signals are divided into low-frequency components and high-frequency components, both of which are subjected to delay processing in correspondence with desired positions of focal points with respect to speaker units respectively. Delayed low-frequency components are further subjected to weighting using a first window function. Delayed high-frequency components are subjected to weighting using a second window function (e.g., a Hamming window function). Weighted high-frequency components and weighted low-frequency components are added together with respect to the speaker units, which are thus driven respectively. The first window function applied to low-frequency components is made moderate in weighting in comparison with the second window function applied to high-frequency components; thus, it is possible to reduce differences of sound directivities between low-frequency components and high-frequency components of audio signals.

5 Claims, 7 Drawing Sheets

U.S. PATENT DOCUMENTS

| | | | | |
|---|---|---|---|---|
| 4,218,585 | A | 8/1980 | Carver | |
| 5,119,428 | A | 6/1992 | Prinssen | |
| 5,146,507 | A * | 9/1992 | Satoh et al. | 381/103 |
| 5,233,664 | A | 8/1993 | Yanagawa et al. | |
| 5,301,237 | A | 4/1994 | Fosgate | |
| 5,581,618 | A | 12/1996 | Satoshi et al. | |
| 5,789,689 | A * | 8/1998 | Doidic et al. | 84/603 |
| 5,809,150 | A | 9/1998 | Eberbach | |
| 5,974,152 | A | 10/1999 | Fujinami | |
| 6,128,395 | A | 10/2000 | De Vries | |
| 6,332,026 | B1 | 12/2001 | Kuusama et al. | |
| 6,546,105 | B1 | 4/2003 | Katayama et al. | |
| 6,754,352 | B2 | 6/2004 | Kanai et al. | |
| 7,003,124 | B1 * | 2/2006 | Thiel | 381/99 |
| 7,027,600 | B1 | 4/2006 | Kaji et al. | |
| 7,113,602 | B2 * | 9/2006 | Oinoue et al. | 381/17 |
| 7,116,788 | B1 | 10/2006 | Chen et al. | |
| 2001/0022835 | A1 | 9/2001 | Matsuo | |
| 2002/0071574 | A1 | 6/2002 | Aylward et al. | |
| 2003/0086577 | A1 | 5/2003 | Lee | |
| 2005/0089181 | A1 | 4/2005 | Polk, Jr. | |
| 2006/0256979 | A1 | 11/2006 | Usui et al. | |
| 2007/0030976 | A1 | 2/2007 | Konagai | |
| 2007/0165878 | A1 | 7/2007 | Konagai | |
| 2007/0230724 | A1 | 10/2007 | Konagai et al. | |

FOREIGN PATENT DOCUMENTS

| | | | |
|---|---|---|---|
| JP | 1-25480 | B2 | 5/1989 |
| JP | 2-241195 | A | 9/1990 |
| JP | 3-159500 | A | 7/1991 |
| JP | 4-127700 | A | 4/1992 |
| JP | 5-103391 | A | 4/1993 |
| JP | 5-317310 | A | 12/1993 |
| JP | 6-205496 | A | 7/1994 |
| JP | 9-233588 | A | 9/1997 |
| JP | 9-233591 | A | 9/1997 |
| JP | 9-512159 | A | 12/1997 |
| JP | 10-304500 | A | 11/1998 |
| JP | 11-027604 | A | 1/1999 |
| JP | 2000-92578 | A | 3/2000 |
| JP | 2003-510924 | A | 3/2003 |
| WO | WO 01/23104 | A2 | 4/2001 |

OTHER PUBLICATIONS

Related co-pending U.S. Appl. No. 10/558,542; Akira USUL; "Array Speaker System"; filed Nov. 29, 2005; Spec. pp. 1-20; Figs. 1-12.

From related co-pending U.S. Appl. No. 10/558,542: Relevant portion of International Search Report of corresponding PCT Application PCT/JP2004/007911.

Related co-pending U.S. Appl. No. 10/558,945; Yusuke Konagai; "Array Speaker System"; filed Nov. 30, 2005; Spec. pp. 1-19; Figs. 1-15.

From related co-pending U.S. Appl. No. 10/558,945: Relevant portion of International Search Report of corresponding PCT Application PCT/JP2004/007917.

Kitzen, W.J.W.; Multiple loudspeaker arrays using Bessel coefficients, Electronic Components and applications, vol. 5 No. 4, Sep. 1983, p. 200-205, Eindhoven, the Netherlands.

* cited by examiner

ARRAY SPEAKER SYSTEM

TECHNICAL FIELD

This invention relates to array speaker systems in which plural speaker units are arranged in an array.

BACKGROUND ART

Conventionally, technologies for controlling audio signal beams (i.e., sound waves converted into beams having directivities) by use of array speakers, in which plural speaker units are regularly arranged, are known. For example, Japanese Unexamined Patent Application Publication No. H03-159500 and Japanese Unexamined Patent Application Publication No. S63-9300 disclose technologies regarding array speaker systems.

A control method for sound directivity in an array speaker will be described with reference to FIG. 7.

In FIG. 7, reference numerals sp-1 to sp-n designate speaker units that are linearly arranged with prescribed distances therebetween. In the case of generation of an audio signal beam emitted towards a focal point X, a circle Y whose radius matches a distance L from the focal point X is drawn, and delay times (=Li/speed of sound (340 m/s)) are calculated in response to distances Li between the speaker units sp-i (where i=1, . . . , n) and the intersection points, at which the circle Y intersects line segments interconnecting between the focal point X and the speaker units sp-1 to sp-n respectively, and wherein they are applied to input signals of the speaker units sp-i. Thus, it is possible to control the sound directivity of the array speaker in such a way that audio signal beams respectively emitted from the plural speaker units sp-1 to sp-n reach the focal point X at the same time.

FIG. 8 is an illustration showing an example of the relationship between the focal point and sound directivity, and it shows a contour distribution of sound pressure energy with respect to a single frequency signal when plural speaker units are arrayed in an X-axis direction about the zero-centimeter-position of the X-axis. As shown in FIG. 8, it is possible to produce an intense sound directivity in a direction towards a focal point designated by a symbol "x ".

As an application of this technology, there is provided a technology in which different sound directivities are imparted to different content so as to realize hearing of different content in the left and right of a room respectively. This technology is disclosed in Japanese Unexamined Patent Application Publication No. H11-27604, for example.

In general, audio signals have a wide range of frequency components within audio frequencies ranging from 20 Hz to 20 kHz. Such a frequency range matches a range of wavelengths ranging from 17 m to 1.7 cm. In the practical form of an array speaker, the sound directivity control is performed in such a way that audio signal beams emitted from plural speaker units may reach a specific focal point with the same phase. This indicates that at the focal point, audio signal beams converge at the same phase irrespective of frequencies of audio signals; hence, audio signal beams may be emphasized. In contrast, audio signal beams may converge substantially at the same phase at different positions outside of the focal point because of different wavelengths, which differ in response to frequencies thereof. That is, there occurs a phenomenon in which sound directivity differs in response to frequency.

FIG. 9 shows a simulation result with regard to sound directivity for a single frequency signal of 1 kHz; and FIG. 10 shows a simulation result with regard to sound directivity for a single frequency signal of 2 kHz. The same focal point is set in FIGS. 9 and 10.

In comparison between FIG. 9 and FIG. 10, it is obvious that when similar sound directivity control is performed with respect to a prescribed focal point, the sound directivity becomes intense (so as to form a sharp contour distribution of sound pressure energy) as frequencies become higher.

The aforementioned differences of sound directivity indicate that at any position outside of the focal point, source audio signals become out of balance in frequencies. At a position distant from the focal point, it is possible to realize hearing of low-frequency sound to some extent; however, hearing of high-frequency sound may be rapidly damped. Essentially, sound directivity control increases sound pressure energy at the focal point but decreases sound pressure energy at the other positions. In the practical form of an application, it is necessary for sweet spots allowing audio signals to be appreciated with a certain level to have appropriate areas. For this reason, it is preferable that a similar sound directivity distribution be applied to both of the high-frequency sound and low-frequency sound to some extent.

This invention is made in consideration of the aforementioned circumstances; hence, it is an object of the invention to provide an array speaker system having good sound directivity.

DISCLOSURE OF THE INVENTION

In an array speaker system of this invention, prescribed time differences are imparted to plural speaker units, which are arranged in an array, so as to perform directivity control on audio signal beams, wherein a relatively large weight is imparted to the speaker unit arranged in the center of the array speaker, while relatively small weights are imparted to other speaker units arrayed at the periphery of the array speaker. In addition, differences of weight coefficients between the center speaker unit and the peripheral speaker units in the array speaker are set in such a way that differences of weight coefficients applied to low-frequency components of input audio signals are smaller than differences of weight coefficients applied to high-frequency components of input audio signals.

With respect to high-frequency components of input audio signals, a relatively large weight is imparted to the center speaker unit in the array speaker, while relatively small weights are imparted to the peripheral speaker units. With respect to low-frequency components, the same weight is applied to both the center speaker unit and all of the peripheral speaker units in the array speaker.

Furthermore, input audio signals are divided into three frequency bands, i.e., a low-frequency band, an intermediate-frequency band, and a high-frequency band, wherein with respect to the high-frequency band, a relatively large weight is imparted to the center speaker unit in the array speaker, while relatively small weights are imparted to the peripheral speaker units. With respect to the intermediate-frequency band, differences of weights respectively imparted to the center speaker unit and the peripheral speaker units are reduced compared with differences of weights respectively imparted to them with respect to the high-frequency band; alternatively, the same weight is imparted to all of them. With respect to the low-frequency band, no time difference is applied to all the speaker units, so that the same weight is imparted to both the center speaker unit and all of the peripheral speaker units in the array speaker.

This reduces differences of outlines of sound directivity distributions between high-frequency components and low-frequency components of input audio signals.

BEST MODE FOR CARRYING OUT THE INVENTION

This invention will be described in detail by way of preferred embodiments with reference to the accompanied drawings.

First, window functions for use in array speaker systems according to this invention will be described with reference to FIGS. 4 to 6; then, embodiments of this invention will be described.

Figure 9:
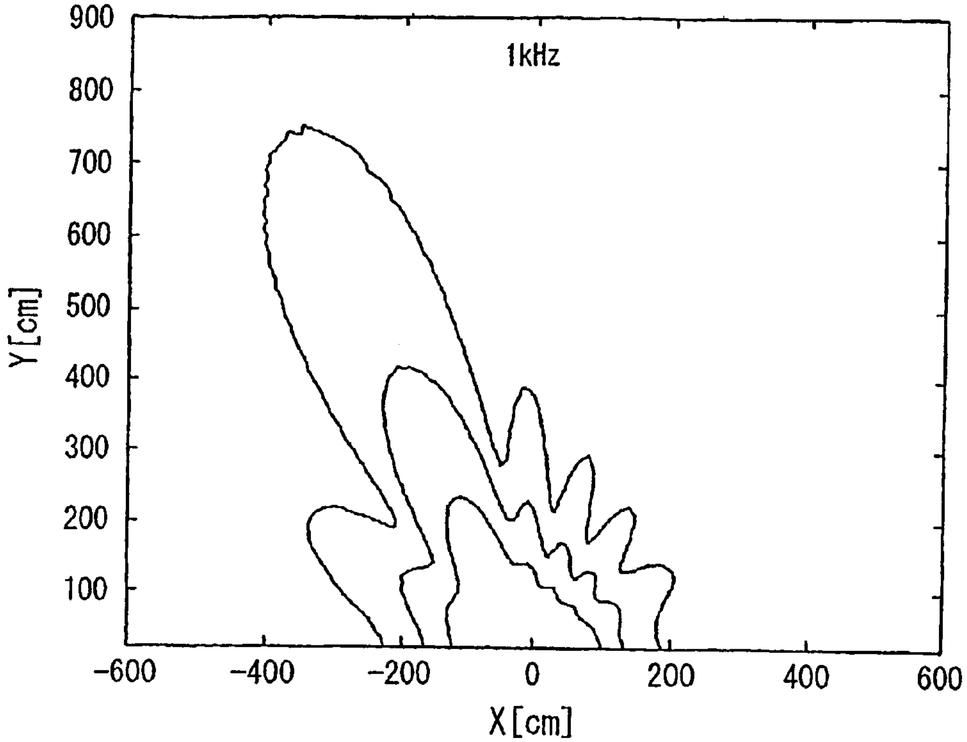
FIG. 9 is a graph showing a simulation result regarding a sound directivity distribution for a sound based on a frequency signal of 1 kHz.
Figure 10:
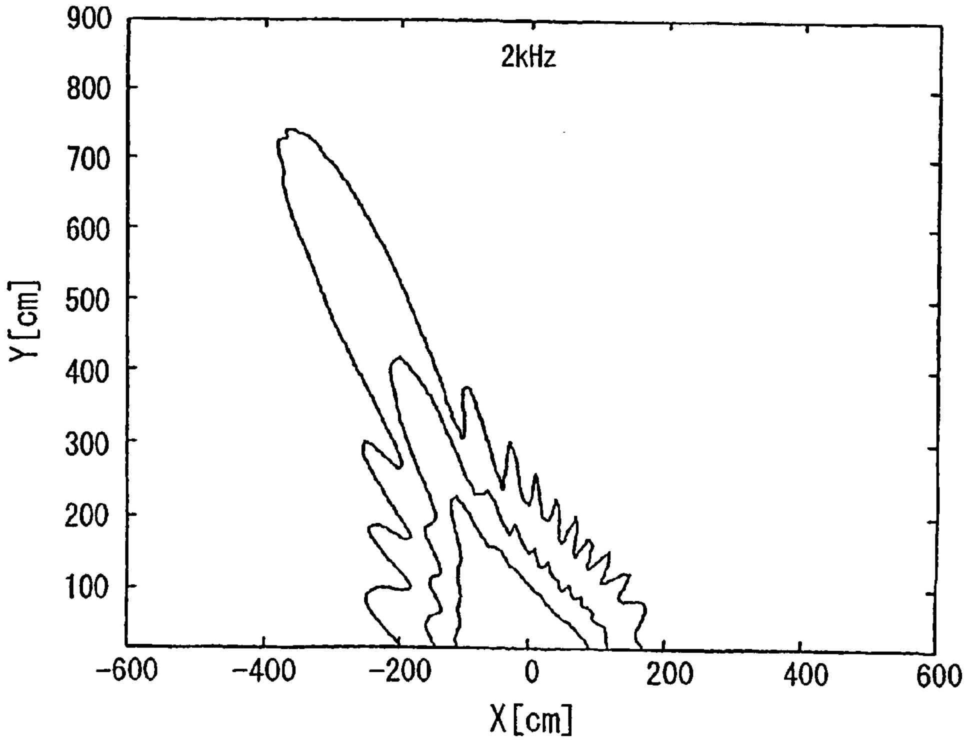
FIG. 10 is a graph showing a simulation result regarding a sound directivity distribution for a sound based on a frequency signal of 2 kHz.

It can be understood in view of the sound directivity distributions of array speakers shown in FIGS. 9 and 10 that contours of sound pressure energy may ripple in a comb-like manner at certain positions not lying at a position of primary direction. In order to correct irregular outlines of sound directivity distributions, it is necessary to introduce window functions (excluding rectangular windows) in response to positions of speaker units. Such window functions are used for extracting certain ranges of time-related functions such as the Fourier transform with prescribed weights therefor, wherein it is possible to use the Hamming window and Hanning window for easing the Gibbs phenomenon. That is, within plural speaker units forming an array speaker, a weight (or a gain) applied to a center speaker unit is increased, while weights applied to speaker units at side-end positions are decreased, thus correcting the outline of a sound directivity distribution.

Figure 4:
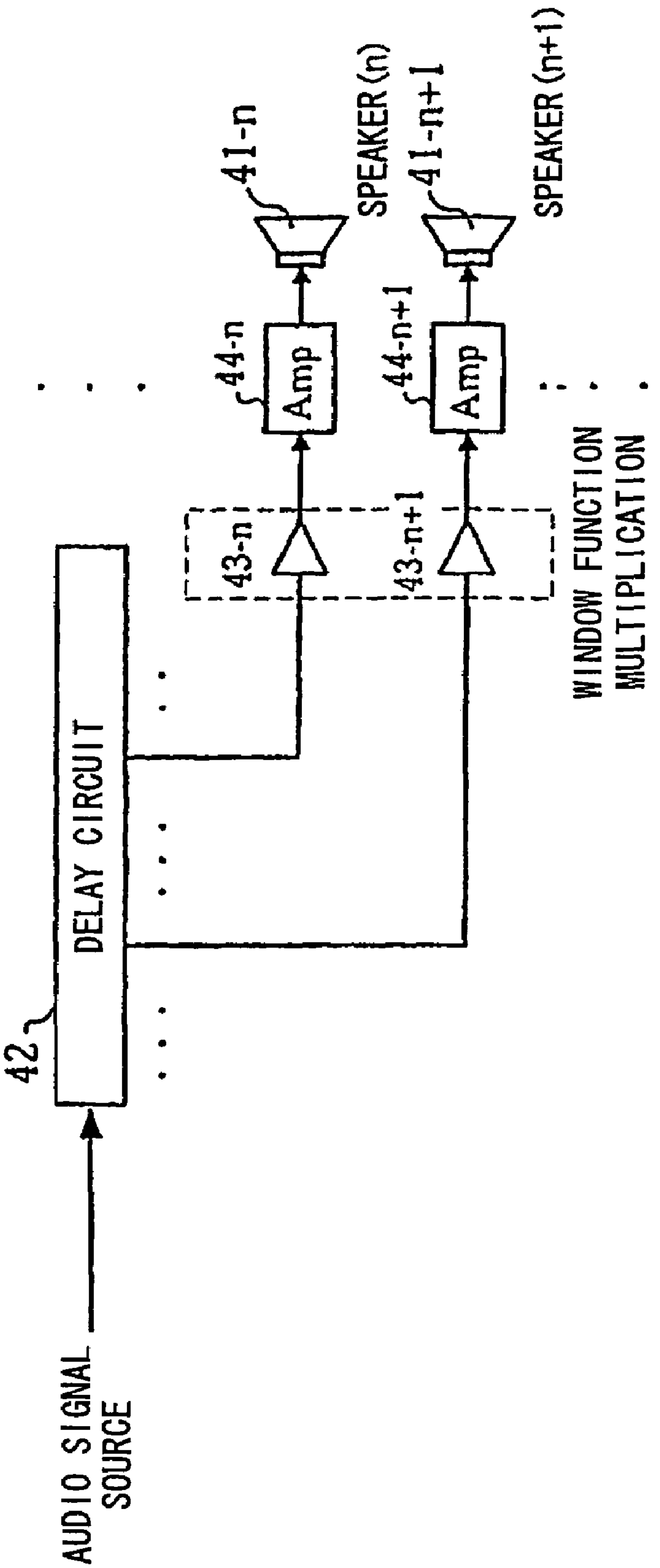
FIG. 4 is a block diagram showing essential parts of a control circuit of an array speaker introducing a window function.

FIG. 4 is a block diagram showing essential parts in the constitution of a control circuit of an array speaker introducing a window function. This control circuit performs delay processing, multiplication, and addition by way of digital processing; however, D/A converts and A/D converters therefor are not illustrated. In addition, other control circuit elements such as a microcomputer for performing calculation and setup of delay times for the purpose of sound directivity control are not illustrated.

In FIG. 4, reference numerals 41-*n* and 41-*n*+1 designate n-numbered and (n+1)-numbered speaker units within an array speaker. An input audio signal applied to the control circuit is supplied to the delay circuit 42, in which it is then output at taps realizing delay times that are imparted to the speaker units in conformity with desired sound directivities (i.e., focal point positions of audio signal beams). The delay circuit 42 outputs audio signals having delay times corresponding to the speaker units to multipliers 43-*n* and 43-*n*+1, in which the audio signals are multiplied by prescribed coefficients realizing a window function; then, they are amplified in amplifiers 44-*n* and 44-*n*+1; thereafter, they are supplied to the speaker units 44-1 and 44-*n*+1. That is, the speaker units emit audio signal beams, all of which reach a single point (i.e., a certain focal point) within a prescribed space with the same phase; thus, it is possible to realize a desired sound directivity.

Figure 5:
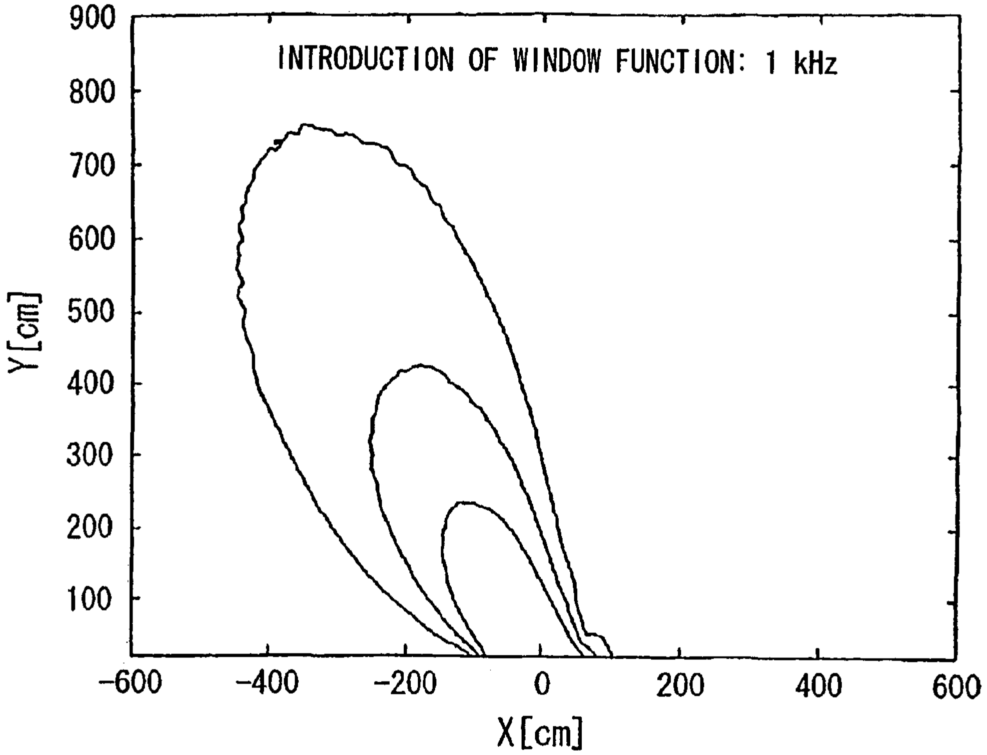
FIG. 5 is a graph showing a simulation result regarding a sound directivity distribution for a frequency signal of 1 kHz with the introduction of a window function.
Figure 6:
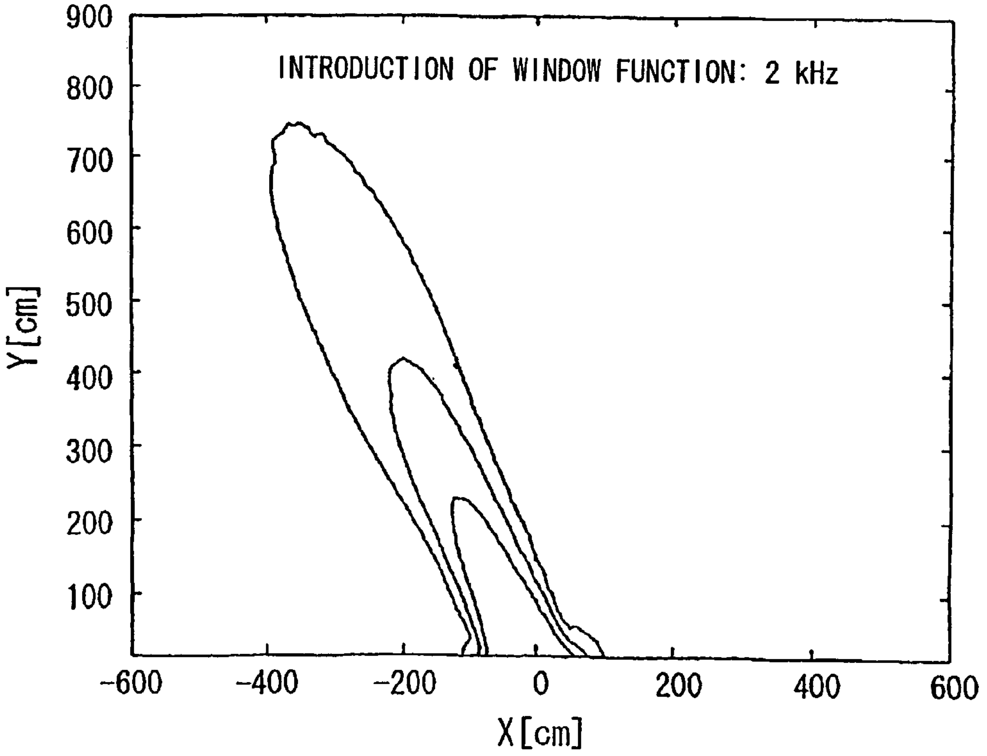
FIG. 6 is a graph showing a simulation result regarding a sound directivity distribution for a frequency signal of 1 kHz with the introduction of a window function.
Figure 7:
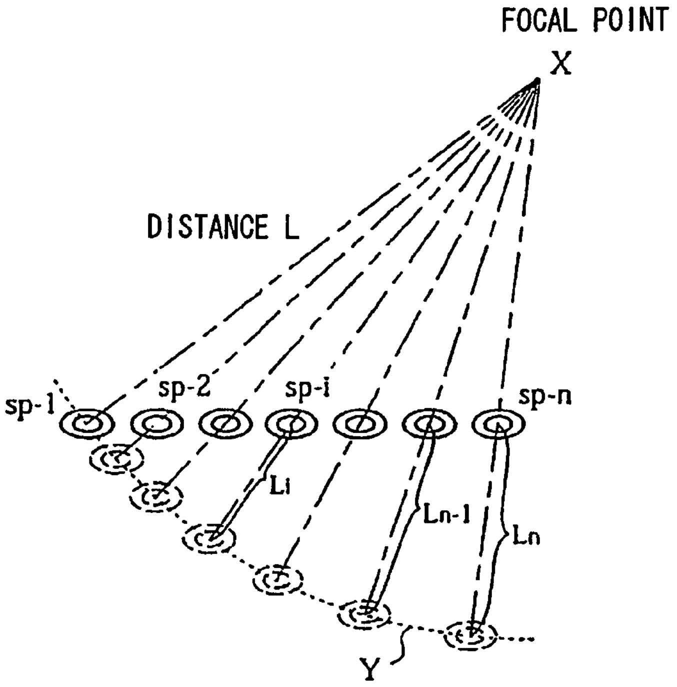
FIG. 7 is an illustration for explaining a sound directivity control in an array speaker system.
Figure 8:
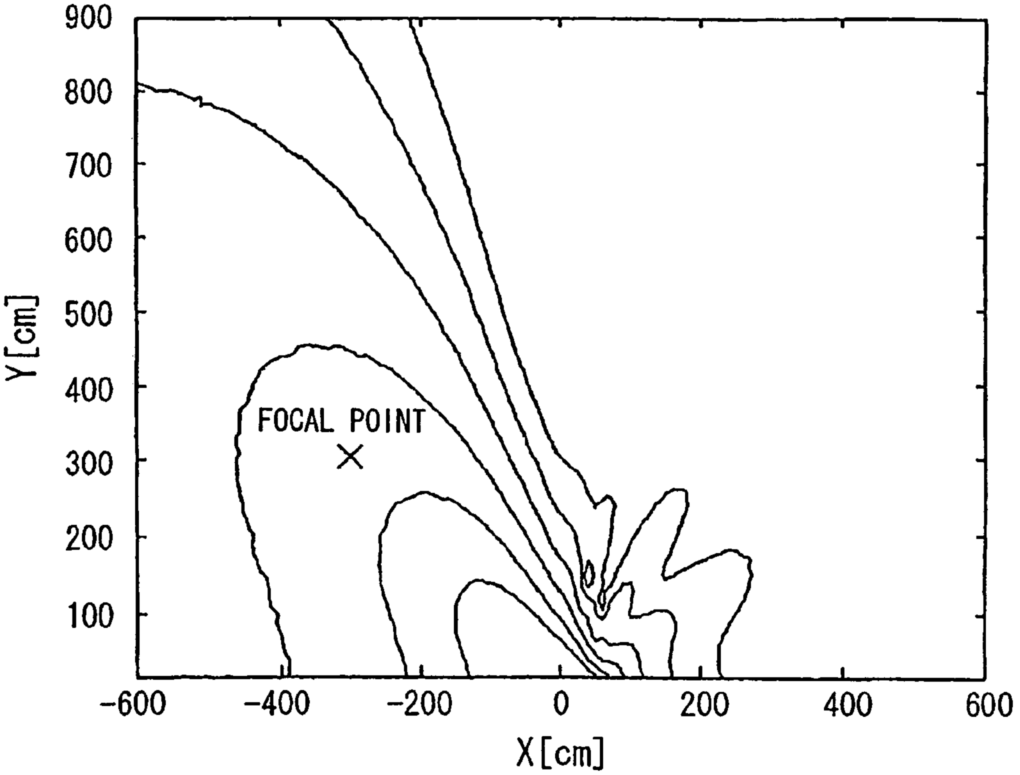
FIG. 8 is a graph showing an example of a sound directivity distribution with respect to sound emitted from an array speaker.

FIGS. 5 and 6 are graphs showing sound directivity distributions that are formed upon the introduction of the aforementioned window function. Similarly to FIG. 9, FIG. 5 shows a sound directivity distribution that is formed when a window function is applied to a frequency signal of 1 kHz. Similar to FIG. 10, FIG. 6 shows a sound directivity distribution that is formed when a window function is applied to a frequency signal of 2 kHz. As the window function, the present embodiment adopts the aforementioned Hamming window.

It is obvious upon the comparison between FIGS. 9 and 5 and upon the comparison between FIGS. 10 and 6 that the outlines of the sound directivity distributions become entirely smooth upon the introduction of the window function, wherein sound is broadened in distribution with respect to a main directivity; and the outlines of contour waveforms of sound pressure energy can be freed from irregularity.

In order to broaden a sweet spot at a listening position, it is necessary to apply a prescribed weight to a designated outline of the sound directivity distribution (or a designated width of the sound directivity distribution) lying in the main directivity compared with the overall outline of the sound directivity distribution. In consideration of the simulation results regarding the sound directivity distributions shown in FIGS. 9 and 10 and shown in FIGS. 5 and 6, it is possible to produce a sound directivity distribution, which is formed by overlapping the graphs of FIGS. 9 and 6 together, by way of the selection of similar outlines of sound directivity distributions lying in the main directivity with respect to the frequency signals of 1 kHz and 2 kHz. That is, no window function is applied to the sound directivity distribution for the frequency signal of 1 kHz, but a window function is applied to the sound directivity distribution for the frequency signal of 2 kHz; thus, it is possible to realize more ideal outlines of sound directivity distributions compared with aforementioned outlines of sound directivity distributions that are formed by effecting the same digital processing on all frequency signals.

As described above, by controlling the application of window functions with respect to frequency signals, it is possible to realize substantially flat audio frequency characteristics with broad sweet spots.

That is, the array speaker system of this invention is designed such that applied window functions have different characteristics in response to frequency bands respectively; specifically, moderate window functions (realizing small differences between the weight imparted to the center speaker unit and the weights imparted to the peripheral speaker units in an array speaker) are applied to low frequencies, thus broadening a sweet spot with substantially flat frequency characteristics; hence, it is possible to produce a preferred sound directivity distribution.

Next, embodiments of array speaker systems, which are designed based on the aforementioned knowledge, will be described.

Figure 1:
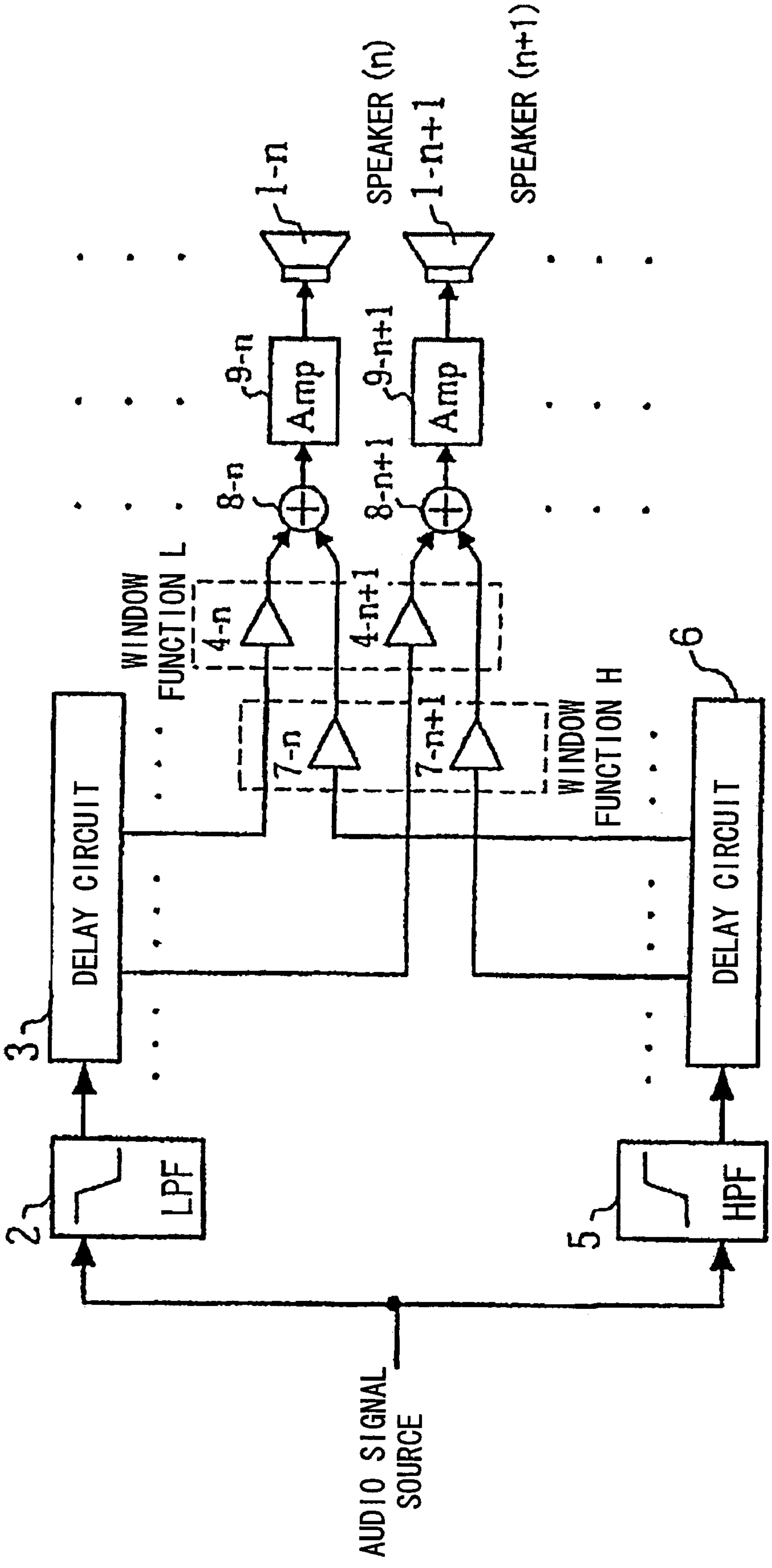
FIG. 1 is a block diagram showing the constitution of a control circuit for an array speaker system in accordance with a first embodiment of this invention.

FIG. 1 is a block diagram showing essential parts of an array speaker system in accordance with a first embodiment of this invention. In the first embodiment, audio signals are divided into two frequency bands, i.e., high-frequency components and low-frequency components, so that window functions having different characteristics are applied to these frequency bands respectively. Similar to FIG. 4, FIG. 1 does not include illustrations of the A/D converter, D/A converters, or control circuit.

FIG. 1 shows only the circuits regarding n-numbered and (n+1)-numbered speaker units, designated by reference numerals 1-*n* and 1-*n*+1 respectively, included in an array speaker system; of course, the other speaker units can be realized using a similar circuit constitution. In FIG. 1, reference numeral 2 designates a low-pass filter (LPF) for extracting low-frequency components of input audio signals; and reference numeral 5 designates a high-pass filter (HPF) for extracting high-frequency components. Due to the provision of the filters 5 and 6, input audio signals corresponding to sources are divided into two frequency bands, i.e., low-frequency components and high-frequency components.

Low-frequency components of input audio signals transmitted through the LPF 2 are supplied to a delay circuit 3 having plural taps; and delay signals are extracted from the taps for imparting delay times suited to sound directivities (i.e., directivities of audio signal beams) to be applied to the speaker units respectively and are then supplied to multipliers 4-*n* and 4-*n*+1 arranged in connection with the speaker units 1-*n* and 1-*n*+1 respectively, whereby they are multiplied by prescribed coefficients realizing a window function L applied to low-frequency components.

High-frequency components of input audio signals transmitted through the HPF 5 are supplied to a delay circuit 6 having plural taps; and delay signals are extracted from the taps for imparting delay times suited to sound directivities to be applied to the speaker units respectively and are then supplied to multipliers 7-*n* and 7-*n*+1 arranged in connection with the speaker units 1-*n* and 1-*n*+1 respectively, wherein they are multiplied by prescribed coefficients realizing a window function H applied to high-frequency components. Herein, the same delay time is set with respect to each of the speaker units; hence, the delay circuits 3 and 6 are set up in a similar manner.

Low-frequency signals output from the multipliers 4-*n* and 4-*n*+1 and high-frequency signals output from the multipliers 7-*n* and 7-*n*+1 are respectively added together in adders 8-*n* and 8-*n*+1 arranged in connection with the speaker units 1-*n* and 1-*n*+1; then, addition signals are respectively amplified in amplifiers 9-*n* and 9-*n*+1; thereafter, they are supplied to the speaker units 1-*n* and 1-*n*+1.

A Hamming window function (i.e., an intense window function) is directly adapted as the window function H for high-frequency components. As the window function L for low-frequency components, it is possible to use a certain window function realizing small differences between weight coefficients applied to the center speaker unit and weight coefficients applied to the peripheral speaker units in an array speaker (or realizing a moderate sound directivity distribution); alternatively, no window function is used (that is, the same weight coefficient "1" is set up with respect to all the speaker units).

Thus, it is possible to ease the concentration of sound pressure energy in terms of the sound directivity for high-frequency components; hence, the outline of the sound directivity distribution for high-frequency components can be made similar to the outline of the sound directivity distribution for low-frequency components. As a result, it is possible to broaden a sweet spot realizing sound reproduction with substantially flat frequency characteristics.

Figure 2A:
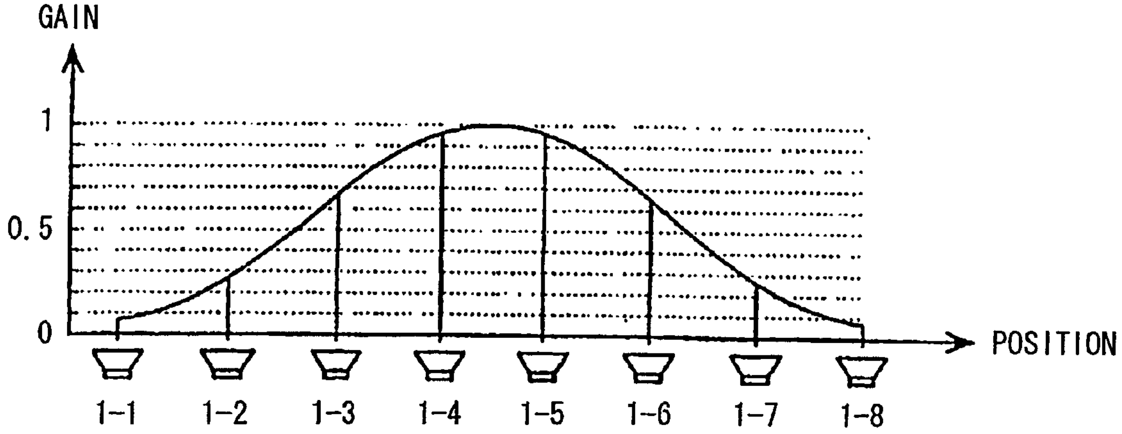
FIG. 2A is a graph showing a window function (i.e., a Hamming window) applied to high-frequency components of input audio signals.
Figure 2B:
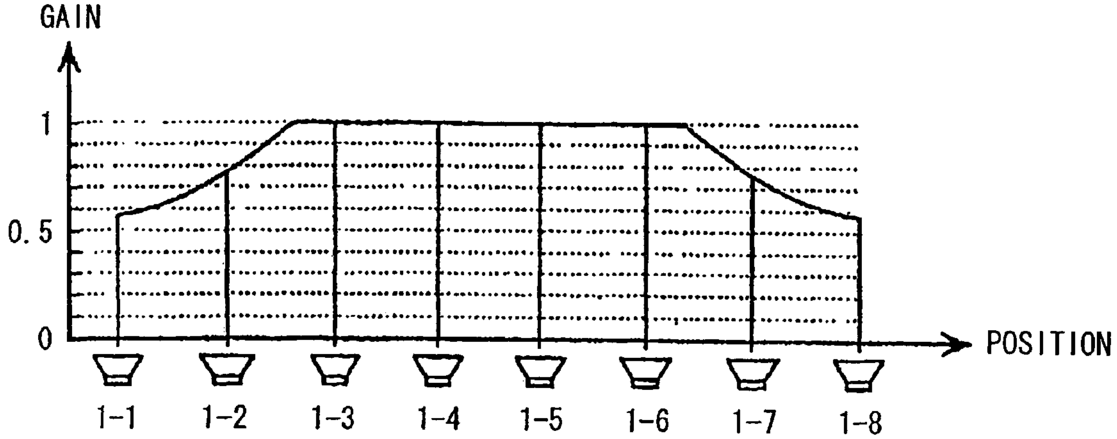
FIG. 2B is a graph showing a window function applied to low-frequency components of input audio signals.

FIGS. 2A and 2B are graphs diagrammatically showing the window function H for high-frequency components and the window function L for low-frequency components. That is, FIG. 2A shows an example of the window function H for high-frequency components, which indicates a Hamming window. This shows the window function adapted to an array speaker constituted by eight speaker units designated by reference numerals 1-1 to 1-8, wherein weight coefficients applied to these speaker units are set to 0.0800, 0.2532, 0.6424, 0.9544, 0.9544, 0.6424, 0.2532, and 0.0800.

FIG. 2B shows an example of the window function L for low-frequency components, wherein an offset is applied to the aforementioned Hamming window, thus reducing differences between the weight coefficient applied to the center speaker unit and the weight coefficients applied to the peripheral speaker units in an array speaker. The maximum value of the weight coefficients is set to "1". Herein, the offset is set to 0.5; hence, weight coefficients applied to the eight speaker units 1-1 to 1-8 are set to 0.5800, 0.7532, 1, 1, 1, 1, 0.7532, and 0.5800 respectively.

Incidentally, the moderate window function L applied to low-frequency components is not necessarily limited to the aforementioned example; hence, it is possible to use ones created by various methods.

For example, upon the extraction of the square root of a Hamming window, weight coefficients applied to the speaker units 1-1 to 1-8 may be set to 0.5800, 0.7532, 1, 1, 1, 1, 0.7532, and 0.5800 respectively.

Alternatively, upon the calculation of the average between a Hamming window value and "1", weight coefficients applied to the speaker units 1-1 to 1-8 may be set to 0.5400, 0.6266, 0.8212, 0.9772, 0.9772, 0.8212, 0.6266, and 0.5400 respectively.

By use of the aforementioned simple methods, it is possible to reduce differences formed between the weight applied to the center speaker unit and the weights applied to the peripheral speaker units in an array speaker; thus, it is possible to realize an intermediate sound directivity distribution lying between the sound directivity distribution shown in FIG. 10 (i.e., no window function involved) and the sound directivity distribution shown in FIG. 6 (i.e., a Hamming window function applied).

The first embodiment is designed to divide input audio signals into two frequency bands, i.e., low-frequency components and high-frequency components, by way of the LPF 2 and the HPF 5. This invention is not necessarily limited to the constitution of the first embodiment; hence, it is possible to divide input audio signals into three or more frequency bands by further using a band-pass filter (BPF) and the like, wherein weights are imparted to respective frequency signals by use of different window functions.

The first embodiment is designed to use a Hamming window as the window function; of course, it is possible to use other window functions such as a Hanning window.

Realistically, it is difficult to perform sound directivity control in the low-frequency band whose frequency is several hundreds of hertz or less within the frequency bands of input audio signals due to the relationship between the size of the speaker and the wavelength. For this reason, it is preferable to perform gain adjustment realizing a good balance of sound pressure energy at a sweet spot by not subjecting signal components of the low-frequency band, which are separated from audio signals, to sound directivity control or by subjecting them to non-directivity.

Figure 3:
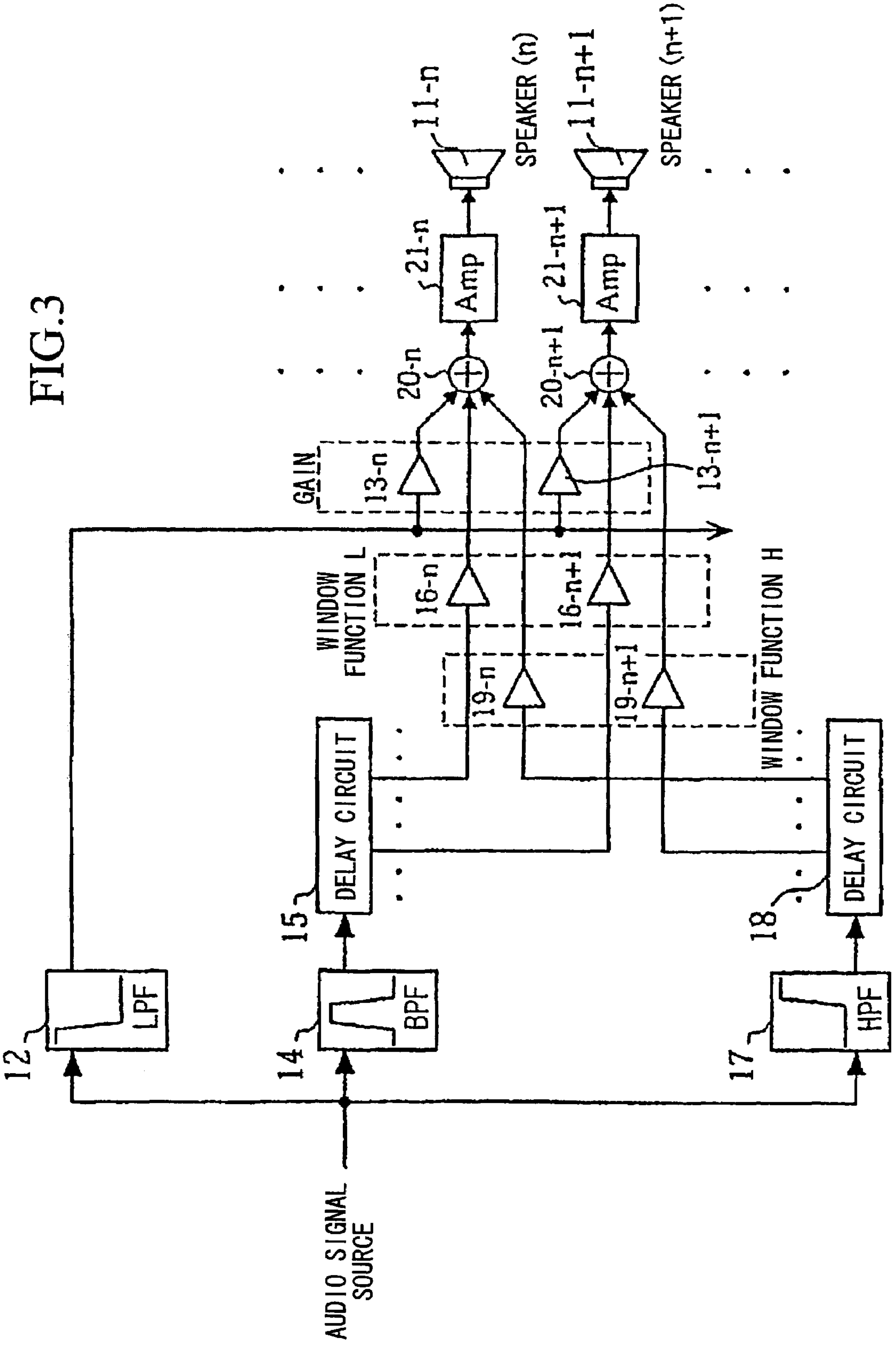
FIG. 3 is a block diagram showing the constitution of a control circuit for an array speaker in accordance with a second embodiment of this invention.

FIG. 3 is a block diagram showing essential parts of a control circuit of an array speaker system in accordance with a second embodiment of this invention, wherein the low-frequency band whose frequency is several hundreds of hertz or less is subjected to non-directivity. Similarly to FIG. 1 showing the first embodiment, FIG. 3 shows only the circuit constitution regarding two speaker units 11-*n* and 11-*n*+1 in the second embodiment.

In FIG. 3, reference numeral 12 designates an LPF whose cutoff frequency is set to several hundreds of hertz; and reference numerals 13-*n* and 13-*n*+1 designate multipliers that impart gains to low-frequency components of signals whose frequencies are several hundreds of hertz or less and which transmit through the LPF 12 in correspondence with the speaker units 11-*n* and 11-*n*+1. These gains are determined in consideration of balances with other frequency bands of signals. Reference numeral 14 designates a BPF for transmitting signals of the intermediate frequency band (which ranges from several hundreds of hertz to one thousand and several hundreds of hertz, for example) therethrough; reference numeral 15 designates a delay circuit that applies delay times to intermediate-frequency components of signals in accordance with sound directivities (i.e., directivities of audio signal beams), which are to be realized by the speaker units respectively; and reference numerals 16-*n* and 16-*n*+1 designate multipliers for imparting weights to intermediate-frequency components of signals, to which different delay times are applied by the delay circuit 15, in accordance with the moderate window function L. Furthermore, reference numeral 17 designates an HPF for transmitting high-frequency components of signals therethrough; reference numeral 18 designates a delay circuit that is constituted similarly to the delay circuit 15; and reference numerals 19-*n* an 19-*n*+1 designate multipliers that impart weights to high-frequency components of signals, to which different delay times are applied by the delay circuit 18, in accordance with the window function H. Incidentally, it is possible not to adopt the window function by setting all the weights, imparted to intermediate-frequency components of signals, to "1".

Output signals of the multipliers 13-*n*, 16-*n*, and 19-*n* are added together in an adder 20-*n*, an output of which is amplified by an amplifier 21-*n* and is then supplied to the speaker unit 11-*n*. Similarly, output signals of the multipliers 13-*n*+1, 16-n+1, and 19-n+1 are added together in an adder 20-*n*+1, an output of which is amplified by an amplifier 21-*n*+1 and is then supplied to the speaker unit 11-*n*+1.

As described above, the second embodiment is designed such that low-frequency components of signals whose frequencies are several hundreds of hertz or less and which are extracted by the LPF 12 are not subjected to delay processing for controlling sound directivities (i.e., directivities of audio signal beams) but are simply subjected to gain adjustment and are then supplied to the corresponding speaker units.

In the aforementioned second embodiment, it is possible to broaden sweet spots with a good balance of sound pressure energy in a wide range of frequencies ranging from low frequencies to high frequencies.

The aforementioned embodiments are described with respect to a one-dimensional array speaker in which plural speaker units are arrayed in a single line. Similarly, this invention can be applied to a two-dimensional array speaker in which plural speaker units are arrayed in a matrix. In this case, it is divided into one-dimensional arrays in terms of the row direction and column direction so as to realize controlling of sound directivity distributions, wherein values multiplied with weight coefficients in one-dimensional arrays are set as weights to be imparted to speaker units.

As described heretofore, an array speaker system of this invention is designed such that sound wave signals emitted from speaker units are divided into plural frequency bands, wherein an intense window function is applied to the high-frequency band, while a moderate window function is applied to the low-frequency band (alternatively, no window function is applied to the low-frequency band). Thus, it is possible to realize similar outlines of sound directivity distributions over a relatively wide range of frequency bands; hence, it is possible to broaden sweet spots, which allow optimal sound quality to be appreciated, without disturbing balances of frequency characteristics of source audio signals.

Incidentally, this invention is not necessarily limited to the aforementioned embodiments; hence, this invention embraces modifications within the scope of the invention defined by the appended claims.

The invention claimed is:

1. An array speaker system comprising:

an array speaker having a plurality of speaker units arranged in an array, including at least one center speaker unit and a plurality of peripheral speaker units, for emitting audio signal beams with predetermined time differences therebetween so as to control sound directivity; and a control circuit that imparts a first weight to the center speaker unit with respect to high-frequency signal components of input audio signals, and second weights to the peripheral speaker units in the array speaker with respect to the high-frequency signal components of the input audio signals, wherein the first weight is relatively higher than the second weights, wherein the control circuit imparts a third weight to the center speaker unit with respect to low-frequency signal components of the input audio signals, and imparts fourth weights to the peripheral speaker units with respect to the low-frequency signal components of the input audio signals, and wherein differences between the third and fourth weights, which are imparted to the center speaker unit and the peripheral speaker units with respect to the low-frequency signal components, are relatively smaller than the differences between the first and second weights, which are imparted to the center speaker unit and the peripheral speaker units with respect to the high-frequency signal components.

2. An array speaker system comprising:

an array speaker having a plurality of speaker units arranged in an array, including a plurality of center speaker units and a plurality of peripheral speaker units, for emitting audio signal beams with predetermined time differences therebetween so as to control sound directivity, a control circuit that imparts first weights to the center speaker unit with respect to high-frequency signal components of input audio signals, and second weights to the peripheral speaker units with respect to the high-frequency signal components of the input audio signals, wherein the first weights are relatively larger than the second weights, and wherein the control circuit imparts, with respect to low-frequency signal components of the input audio signals, a same weight to all of the center speaker units and all of the peripheral speaker units in the array speaker.

3. An array speaker system comprising:

an array speaker having a plurality of speaker units arranged in an array, including a plurality of center speaker units and a plurality of peripheral speaker units, for emitting audio signal beams with predetermined time differences therebetween so as to control sound directivity;

a circuit that divides the input audio signals into three frequency bands, including low-frequency signal components, intermediate-frequency signal components, and high-frequency signal components; and a control circuit that imparts first weights to the center speaker units with respect to the high-frequency signal components of input audio signals, and second weights to the peripheral speaker units in the array speaker with respect to the high-frequency signal components of the input audio signals, wherein the first weights are relatively larger than the second weights, wherein the control circuit imparts third weights to the center speaker units with respect to the intermediate-frequency signal components of the input audio signals, and fourth weights to the peripheral speaker units with respect to the intermediate-frequency signal components of the input audio signals, wherein differences between the third and fourth weights, which are imparted to the center speaker units and the peripheral speaker units with respect to the intermediate-frequency signal components, are relatively smaller than the differences between the first and second weights, which are imparted to the center speaker units and the peripheral speaker units with respect to the high-frequency signal components, and wherein the control circuit imparts, with respect to low-frequency signal components of the input audio signals, a same weight to all the center speaker units and the peripheral speaker units in the array speaker without applying the time differences to the speaker units.

4. The array speaker system according to claim 1, wherein the third and fourth weights are the same.

5. The array speaker system according to claim 3, wherein the third and fourth weights are the same.

* * * * *